United States Patent
Takahashi et al.

(10) Patent No.: US 12,308,273 B2
(45) Date of Patent: May 20, 2025

(54) BONDING APPARATUS AND METHOD FOR CORRECTING MOVEMENT AMOUNT OF BONDING HEAD

(71) Applicant: SHINKAWA LTD., Tokyo (JP)

(72) Inventors: Makoto Takahashi, Tokyo (JP); Tomonori Nakamura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 420 days.

(21) Appl. No.: 17/603,943

(22) PCT Filed: Apr. 14, 2020

(86) PCT No.: PCT/JP2020/016373
§ 371 (c)(1),
(2) Date: Oct. 14, 2021

(87) PCT Pub. No.: WO2020/213588
PCT Pub. Date: Oct. 22, 2020

(65) Prior Publication Data
US 2022/0199448 A1    Jun. 23, 2022

(30) Foreign Application Priority Data
Apr. 15, 2019 (JP) .................. 2019-076779

(51) Int. Cl.
*H01L 21/68* (2006.01)
*B25J 9/16* (2006.01)
(Continued)

(52) U.S. Cl.
CPC .......... *H01L 21/681* (2013.01); *B25J 9/1697* (2013.01); *B25J 13/08* (2013.01); *G06T 7/0004* (2013.01);
(Continued)

(58) Field of Classification Search
CPC ............. H01L 21/681; H01L 21/67144; H01L 21/67259; H01L 24/00; H01L 2224/75;
(Continued)

(56) References Cited

U.S. PATENT DOCUMENTS 7,087,457 B2   8/2006  Ogata et al.
8,540,001 B2   9/2013  Kihara et al.
(Continued)

FOREIGN PATENT DOCUMENTS

JP   2004241604   8/2004
JP   2010272657   12/2010
(Continued)

OTHER PUBLICATIONS

"International Search Report (Form PCT/ISA/210) of PCT/JP2020/016373", mailed on Jul. 7, 2020, with English translation thereof, pp. 1-4.
Office Action of China Counterpart Application, with partial English translation thereof, issued on May 7, 2024, pp. 1-17.

*Primary Examiner* — Sihar A Karwan
(74) *Attorney, Agent, or Firm* — JCIPRNET

(57) ABSTRACT

A bonding apparatus and method for correcting movement amount of bonding head are provided. The bonding apparatus performs: mark correction of imaging a reference mark using a position detection camera at every prescribed timing and correcting the amount of movement of a bonding head on the basis of the amount of positional deviation between the position of the imaged reference mark and a reference position of the position detection camera; and actual position correction of detecting the actual bonding position of a semiconductor element after bonding using the position detection camera at every timing when the cumulative value of the amounts of correction of the mark correction from the previous actual position correction exceeds a prescribed first threshold and correcting the amount of movement of the (Continued)

bonding head on the basis of the amount of positional deviation between the detected actual bonding position and a target bonding position.

4 Claims, 7 Drawing Sheets

(51) Int. Cl.
*B25J 13/08* (2006.01)
*G06T 7/00* (2017.01)
*G06T 7/73* (2017.01)
*H01L 21/67* (2006.01)
*B25J 11/00* (2006.01)

(52) U.S. Cl.
CPC .......... *G06T 7/73* (2017.01); *H01L 21/67144* (2013.01); *H01L 21/67259* (2013.01); *B25J 11/0095* (2013.01); *G06T 2207/30148* (2013.01); *G06T 2207/30204* (2013.01)

(58) Field of Classification Search
CPC ......... H01L 21/52; B25J 9/1697; B25J 13/08; B25J 11/0095; G06T 7/0004; G06T 7/73; G06T 2207/30148; G06T 2207/30204; G06T 2207/30152; H05K 13/0404
See application file for complete search history.

(56) References Cited

U.S. PATENT DOCUMENTS

| | | | |
|---|---|---|---|
| 10,068,872 | B2 | 9/2018 | Takahashi et al. |
| 2001/0016062 | A1* | 8/2001 | Enokido ................. H01L 24/78 382/152 |
| 2002/0102016 | A1* | 8/2002 | Yamazaki ................. G06T 7/73 382/146 |
| 2002/0166885 | A1* | 11/2002 | Sugawara ............. H01L 21/681 228/103 |
| 2003/0016860 | A1* | 1/2003 | Sugawara .......... G06V 10/7515 382/296 |
| 2003/0075939 | A1* | 4/2003 | Bendat ................... B23K 1/008 257/E21.511 |
| 2009/0098667 | A1* | 4/2009 | Behler .................... H01L 22/12 700/121 |
| 2012/0214258 | A1* | 8/2012 | Kihara ............. H01L 21/67144 228/49.1 |
| 2019/0304852 | A1* | 10/2019 | Seyama ............. H01L 21/6835 |

FOREIGN PATENT DOCUMENTS

| | | |
|---|---|---|
| JP | 5277266 | 8/2013 |
| JP | 6256486 | 1/2018 |
| JP | 2018152375 | 9/2018 |
| JP | 2018166136 | 10/2018 |

* cited by examiner

BONDING APPARATUS AND METHOD FOR CORRECTING MOVEMENT AMOUNT OF BONDING HEAD

CROSS-REFERENCE TO RELATED APPLICATION

This application is a 371 of international application of PCT application serial no. PCT/JP2020/016373, filed on Apr. 14, 2020, which claims the priority benefit of Japan application no. 2019-076779, filed on Apr. 15, 2019. The entirety of each of the above mentioned patent applications is hereby incorporated by reference herein and made a part of this specification.

BACKGROUND

Technical Field

The present invention relates to a configuration of a bonding apparatus and a method for correcting a movement amount of a bonding head attached to the bonding apparatus.

Description of Related Art

As a part of a process of mounting a semiconductor element such as a semiconductor die or the like on a substrate such as a circuit board, a lead frame, or the like, and assembling a package, there is a die bonding process of adsorbing the die from a wafer and bonding the die to the substrate. In the die bonding process, there is a need to accurately bond the die to a bonding surface of the substrate. However, since the substrate surface is heated to a high temperature of about 80° C. to 250° C., due to the high temperature or the radiant heat, a positional deviation of the component may occur and the semiconductor element may not be bonded to an accurate position.

For this reason, the reference member provided in the vicinity of a bonding stage is used as a reference point to detect an amount of heat movement of a bonding head or a variation of an offset volume between a bonding tool and a camera, and correct a bonding position (for example, see Patent Literatures 1 and 2).

In addition, after bonding the semiconductor die to the substrate, the semiconductor element and the substrate after bonding are imaged to inspect an amount of positional deviation of an actual bonding position (for example, see Patent Literature Patent Literature 1: Japanese Patent No. 5277266
Patent Literature 2: Japanese Patent No. 6256486
Patent Literature 3: Japanese Patent Laid-Open No. 2004-241604

SUMMARY

In actual bonding, after a semiconductor die is bonded to a substrate, when a semiconductor element and a substrate after bonding are imaged to detect an amount of positional deviation between an actual bonding position and a target bonding position, and actual position correction of correcting an amount of movement of the bonding head of the next time by the detected amount of positional deviation is performed, it is possible to greatly reduce the amount of positional deviation of the bonding position.

However, it is not realistic to perform actual position correction for every bonding because it takes too much time.

Here, an objective of the present invention is to optimize timing of actual position correction, and improve bonding quality while maintaining productivity.

A bonding apparatus of the present invention includes a bonding head, on which a bonding nozzle configured to bond a semiconductor element adsorbed on a tip thereof onto a substrate or another semiconductor element, and a position detection camera are mounted, configured to move in at least one direction; a reference mark; and a control part configured to adjust a position of the bonding head, the control part performs mark correction of imaging the reference mark using the position detection camera at every prescribed timing and correcting an amount of movement of the bonding head on the basis of an amount of positional deviation between a position of the imaged reference mark and a reference position of the position detection camera; and actual position correction of detecting an actual bonding position of the semiconductor element after bonding using the position detection camera at every other prescribed timing and correcting the amount of movement of the bonding head on the basis of the amount of positional deviation between the detected actual bonding position of the semiconductor element and a target bonding position, and the other prescribed timing is a timing when a cumulative value of amounts of correction of the mark correction from the previous actual position correction exceeds a prescribed first threshold.

In this way, since the actual position correction is performed at every timing when the cumulative value of the amounts of correction of the mark correction from the previous actual position correction exceeds the prescribed first threshold, it is possible to optimize the timing of the actual position correction and improve bonding quality while maintaining productivity.

In the bonding apparatus of the present invention, the other prescribed timing may be a timing when a difference between the amount of correction of the previous mark correction and the amount of correction of the current mark correction exceeds a prescribed second threshold.

Accordingly, even when the actual bonding position suddenly deviates, it is possible to optimize the timing of the actual position correction and improve bonding quality while maintaining productivity.

A method for correcting an amount of movement of a bonding head of the present invention includes a preparing step of preparing a bonding apparatus comprising a bonding head, on which a bonding nozzle configured to bond a semiconductor element adsorbed on a tip thereof onto a substrate or another semiconductor element, and a position detection camera are mounted, configured to move in at least one direction; a mark correction step of imaging the reference mark using the position detection camera at every prescribed timing and correcting an amount of movement of the bonding head on the basis of an amount of positional deviation between a position of the imaged reference mark and a reference position of the position detection camera; and an actual position correction step of detecting an actual bonding position of the semiconductor element after bonding using the position detection camera at every other prescribed timing and correcting the amount of movement of the bonding head on the basis of the amount of positional deviation between the detected actual bonding position of the semiconductor element and a target bonding position, and the actual position correction step is executed when the cumulative value of the amounts of correction corrected in the mark correction step after execution of the previous the actual position correction step exceeds the prescribed first threshold.

In this way, since the actual position correction is performed at every timing when the cumulative value of the amounts of correction of the mark correction from the previous actual position correction exceeds the prescribed first threshold, it is possible to optimize the timing of the actual position correction and improve bonding quality while maintaining productivity.

In the method for correcting an amount of movement of a bonding head of the present invention, the actual position correction step may be executed when a difference between the amount of correction of the previous mark correction step and the amount of correction of the currently executed mark correction step exceeds a prescribed second threshold.

Accordingly, even when the actual bonding position suddenly deviates, it is possible to optimize the timing of the actual position correction and improve bonding quality while maintaining productivity.

The present invention can optimize timing of actual position correction, and improve bonding quality while maintaining productivity.

DESCRIPTION OF THE EMBODIMENTS

Figure 1:
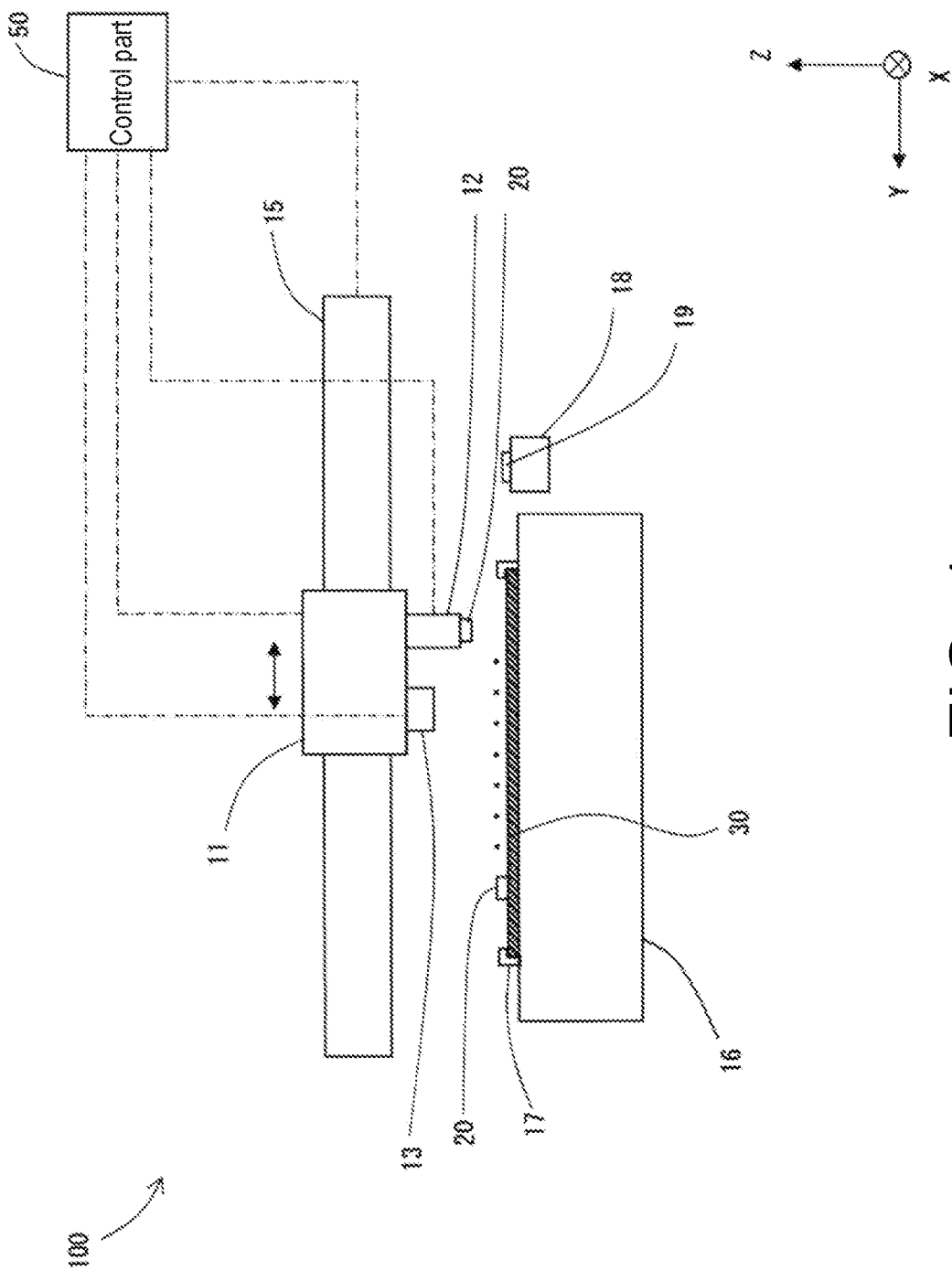
FIG. 1 is a system diagram showing a system configuration of a bonding apparatus of an embodiment.
Figure 2:
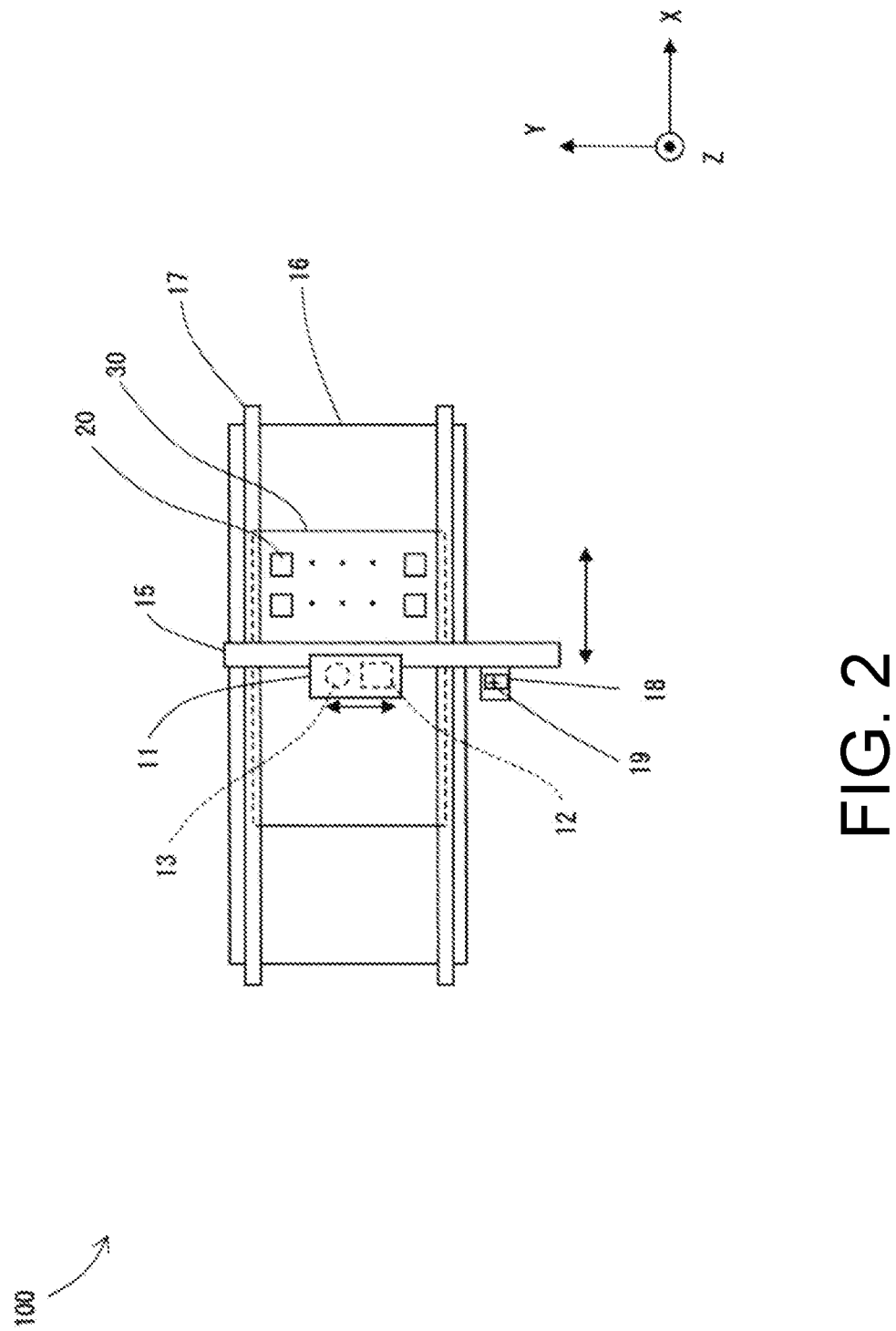
FIG. 2 is a plan view of the bonding apparatus of the embodiment.

Hereinafter, a bonding apparatus 100 of an embodiment will be described with reference to the accompanying drawings. As shown in FIGS. 1 and 2, the bonding apparatus 100 includes a bonding head 11 on which a bonding nozzle 12 and a position detection camera 13 are mounted, a bonding stage 16 configured to adsorb and fix a substrate 30, and a mark stand 18 to which a reference mark 19 is attached. Further, in the following description, an X direction and a Y direction are directions perpendicular to a horizontal plane, and a Z direction is a vertical direction.

The bonding nozzle 12 adsorbs a semiconductor element 20 on a tip thereof and bonds it onto the substrate 30. The position detection camera 13 images the substrate 30 or the semiconductor element 20 and detects a bonding position or the like. The position detection camera 13 has a built-in imaging element using a CCD element or the like. The bonding head 11 is movably attached to a gantry frame 15 in the Y direction and a Y direction driving frame (not shown) is attached to the inside. The gantry frame 15 is movably attached to a base (not shown) in the X direction, and an X direction driving frame (not shown) is attached to the inside. Accordingly, the bonding head 11 is configured to be movable with respect to the bonding stage 16 in an XY direction. Further, the gantry frame 15 is not moved in the X direction and may be configured such that the substrate 30 on the bonding stage 16 moves in the X direction. In this case, the bonding head 11 moves in the Y direction that is one direction.

The bonding stage 16 vacuum-adsorbs the substrate 30 on an upper surface thereof. In addition, the bonding stage 16 includes a heater (not shown) therein, and heats the substrate 30 to a temperature required for bonding. Guides 17 configured to guide the substrate 30 in the X direction are provided on both sides of the bonding stage 16.

The mark stand 18 is provided at a slight distance from the bonding stage 16 in the Y direction on a negative side. The mark stand 18 is attached to the base (not shown), and the reference mark 19 is placed on the upper surface. The reference mark 19 is a plate member with a cross mark on the surface.

The Y direction driving part of the bonding head 11 and the X direction driving part of the gantry frame 15 are connected to a control part 50, and are operated according to a command from the control part 50. The control part 50 is a computer including a CPU and a memory therein, and operates the Y direction driving part of the bonding head 11 and the X direction driving part of the gantry frame 15 to adjust a position of the bonding head 11 in the XY direction.

In addition, the bonding nozzle 12 is connected to the control part 50, the tip is moved in the Z direction according to the command from the control part 50, and the semiconductor element 20 adsorbed on the tip is bonded onto the substrate 30. The position detection camera 13 is connected to the control part 50, and data of an image imaged by the position detection camera 13 is input to the control part 50. The control part 50 adjusts an amount of movement of the bonding head 11 on the basis of the image data input from the position detection camera 13.

Hereinafter, an operation of the bonding apparatus 100 having the above-mentioned configuration will be described with reference to FIGS. 3 to 7.

Figure 3:
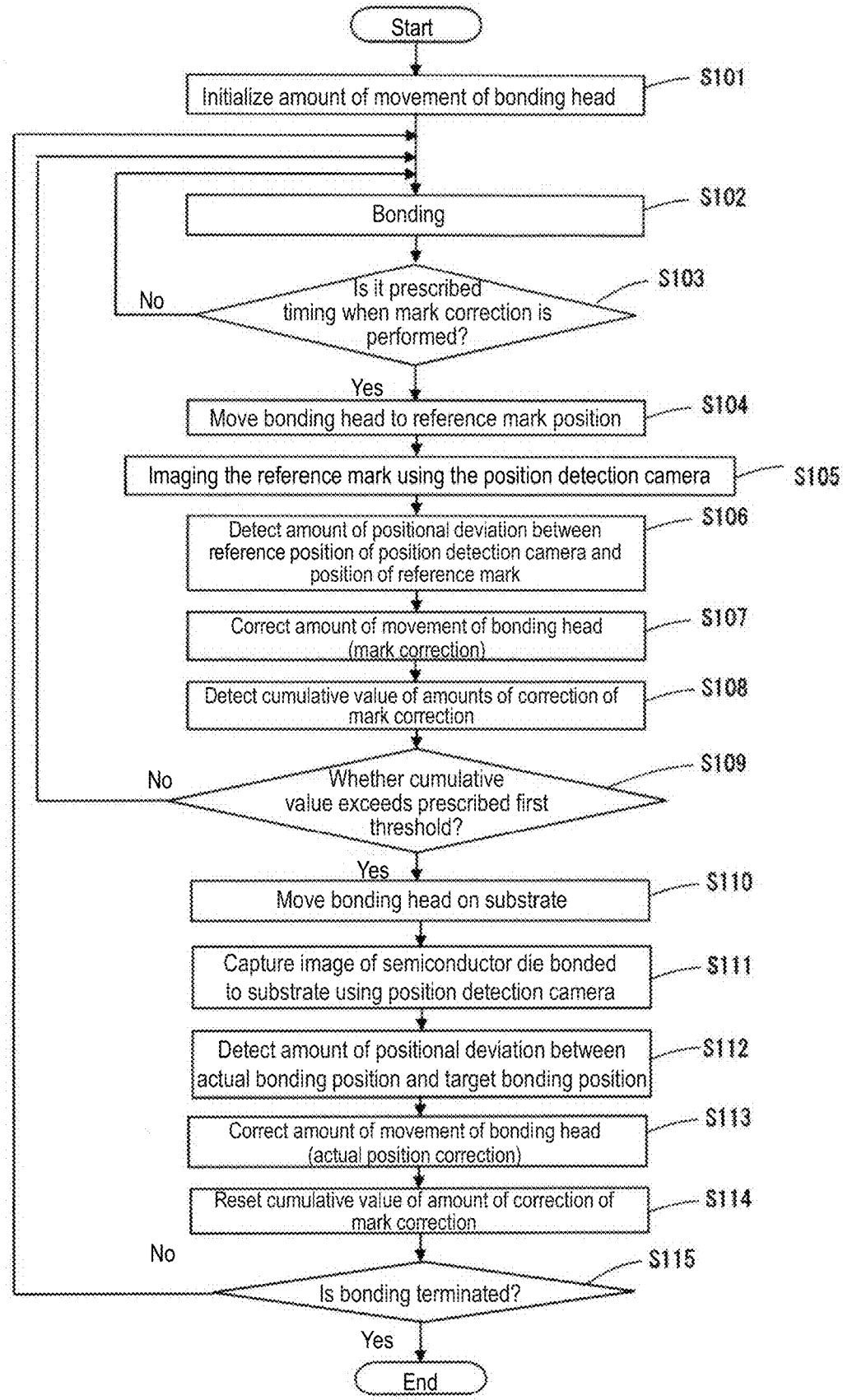
FIG. 3 is a flowchart showing an operation of the bonding apparatus of the embodiment.

First, as shown in step S101 of FIG. 3, the control part 50 performs initialization of the amount of movement of the bonding head 11. As shown in (a) of FIG. 4, the control part 50 moves the bonding head 11 to a position at which an optical axis 13z of the position detection camera 13 is located above the reference mark 19 by the Y direction driving part of the bonding head 11 and the X direction driving part of the gantry frame 15. Then, as shown in (b) of FIG. 4, a reference position 41 of a visual field 40 of the position detection camera 13 coincides with a cross intersection of the reference mark 19. Here, a cross of the reference mark 19 extends along a centerline 19x in the X direction and a centerline 19y in the Y direction, and a line extending in the Z direction through an intersection of the cross of the reference mark 19 is a centerline 19z of the reference mark 19 in the Z direction. In addition, the reference position 41 intersects a centerline 13x in the X direction and a centerline 13y in the Y direction of the visual field 40.

Then, the control part 50 detects actual positions in the X direction and the Y direction of the bonding head 11 at this time and a difference between the position command value in the X direction and the position command value in the Y direction output from the control part 50, and sets the difference to an initial correction value of the amount of movement of the bonding head 11. Further, the initial correction value may be set to zero.

Next, as shown in step S102 of FIG. 3, the control part 50 adsorbs the semiconductor element 20 on the tip of the bonding nozzle 12 at a pick-up stage (not shown), moves the bonding head 11 to a prescribed position using the Y direction driving part of the bonding head 11 and the X direction driving part of the gantry frame 15, lowers the bonding nozzle 12 toward the substrate 30, and thus bonds the semiconductor element 20 to the substrate 30 as shown in FIG. 2.

Then, the control part 50 determines whether a prescribed timing when mark correction is performed has arrived in step S103 of FIG. 3. This determination may be based on, for example, whether a prescribed time has elapsed after start of the bonding or whether the bonding has been performed a prescribed number of times. Here, as will be described with reference to steps S104 to S107 of FIG. 3 below, in the mark correction, the reference mark 19 is imaged using the position detection camera 13, and the amount of movement of the bonding head 11 is corrected on the basis of the amount of positional deviation between the position of the imaged reference mark 19 and the reference position 41 of the position detection camera 13.

When the control part 50 determines NO in step S103 of FIG. 3, the processing returns to step S102 and bonding is continued. Meanwhile, when YES is determined in step S103 of FIG. 3, the processing advances to step S104 of FIG. 3, and an operation of the mark correction is performed.

As shown in step S104 of FIG. 3, the control part 50 moves the bonding head 11 using the Y direction driving part of the bonding head 11 and the X direction driving part of the gantry frame 15 such that the optical axis 13z of the position detection camera 13 becomes a central position of the reference mark 19. As shown in a broken line of (a) of FIG. 5, after the bonding is performed a prescribed number of times, the gantry frame 15, the bonding head 11, or the like thermally expands, and even when the same position command value as upon initialization is input, the position of the optical axis 13z of the position detection camera 13 is a position deviated from the central position of the reference mark 19 as shown in (b) of FIG. 5, the amount of positional deviation in the X direction between the reference position 41 of the visual field 40 of the position detection camera 13 and the cross intersection of the reference mark 19 is $\Delta x1$, and the amount of positional deviation in the Y direction is $\Delta y1$.

Figure 5:
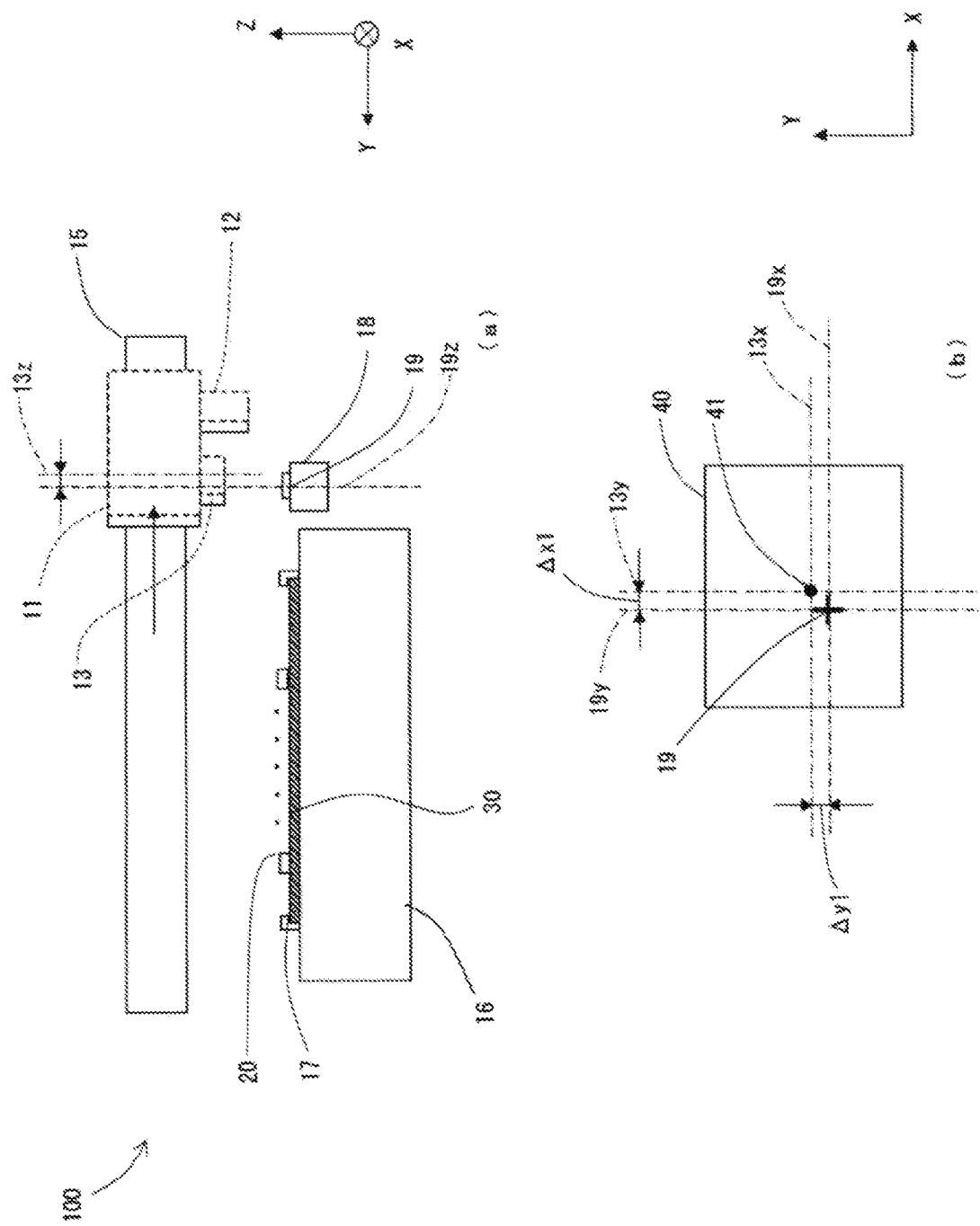
FIG. 5 is a view showing (a) a position of the bonding head and (b) a visual field of the position detection camera upon mark correction of the bonding apparatus of the embodiment.

As shown in step S105 of FIG. 3, the control part 50 images an image of the reference mark 19 as shown in (b) of FIG. 5 using the position detection camera 13. Then, the image imaged by the position detection camera 13 is analyzed to detect the amounts of positional deviation $\Delta x1$ and $\Delta y1$. This detection may be, for example, detection on the basis of the number of pixels between the reference position 41 of the visual field 40 and the cross intersection of the reference mark 19. Then, the control part 50 advances to step S108 of FIG. 3, and corrects the amount of movement of the bonding head 11 by the detected amounts of positional deviation $\Delta x1$ and $\Delta y1$. Operations of step S104 to step S107 of FIG. 3 are operations of the mark correction.

After correcting the amount of movement of the bonding head 11, the control part 50 advances to step S108 of FIG. 3, calculates cumulative values $\Sigma\Delta x1$ and $\Sigma\Delta y1$ of the amounts of positional deviation $\Delta x1$ and $\Delta y1$, and stores the calculated cumulative values in a memory. Here, since each of the amounts of positional deviation $\Delta x1$ and $\Delta y1$ is the same as the correction value upon mark correction, the cumulative values $\Sigma\Delta x1$ and $\Sigma\Delta y1$ are cumulative values of the amounts of correction of the mark correction. Then, the processing advances to step S109 of FIG. 3, and it is determined whether the cumulative values $\Sigma\Delta x1$ and $\Sigma\Delta y1$ exceed a prescribed first threshold $\Delta s$. When NO is determined in step S109 of FIG. 3, the control part 50 returns to step S102 of FIG. 3 to continue the bonding, and repeatedly executes operations of steps S104 to S107 of FIG. 3 in which the mark correction is performed when it is the prescribed timing and calculation of the cumulative values $\Sigma\Delta x1$ and $\Sigma\Delta y1$ shown in step S108 of FIG. 3.

When any one of the cumulative values $\Sigma\Delta x1$ and $\Sigma\Delta y1$ of the amounts of positional deviation $\Delta x1$ and $\Delta y1$ exceeds the prescribed first threshold $\Delta s$ in step S109 of FIG. 3, the control part 50 determines that another prescribed timing when the actual position correction is performed has arrived, and performs the actual position correction shown in steps S110 to S114 of FIG. 3. The actual position correction is an operation of detecting a position of a center 25 that is an actual bonding position of the semiconductor element 20 after bonding using the position detection camera 13, and correcting the amount of movement of the bonding head 11 on the basis of amounts of positional deviation $\Delta x2$ and $\Delta y2$ between the detected position of the center 25 of the semiconductor element 20 and a position of a center 35 of a target bonding position 34.

Figure 6:
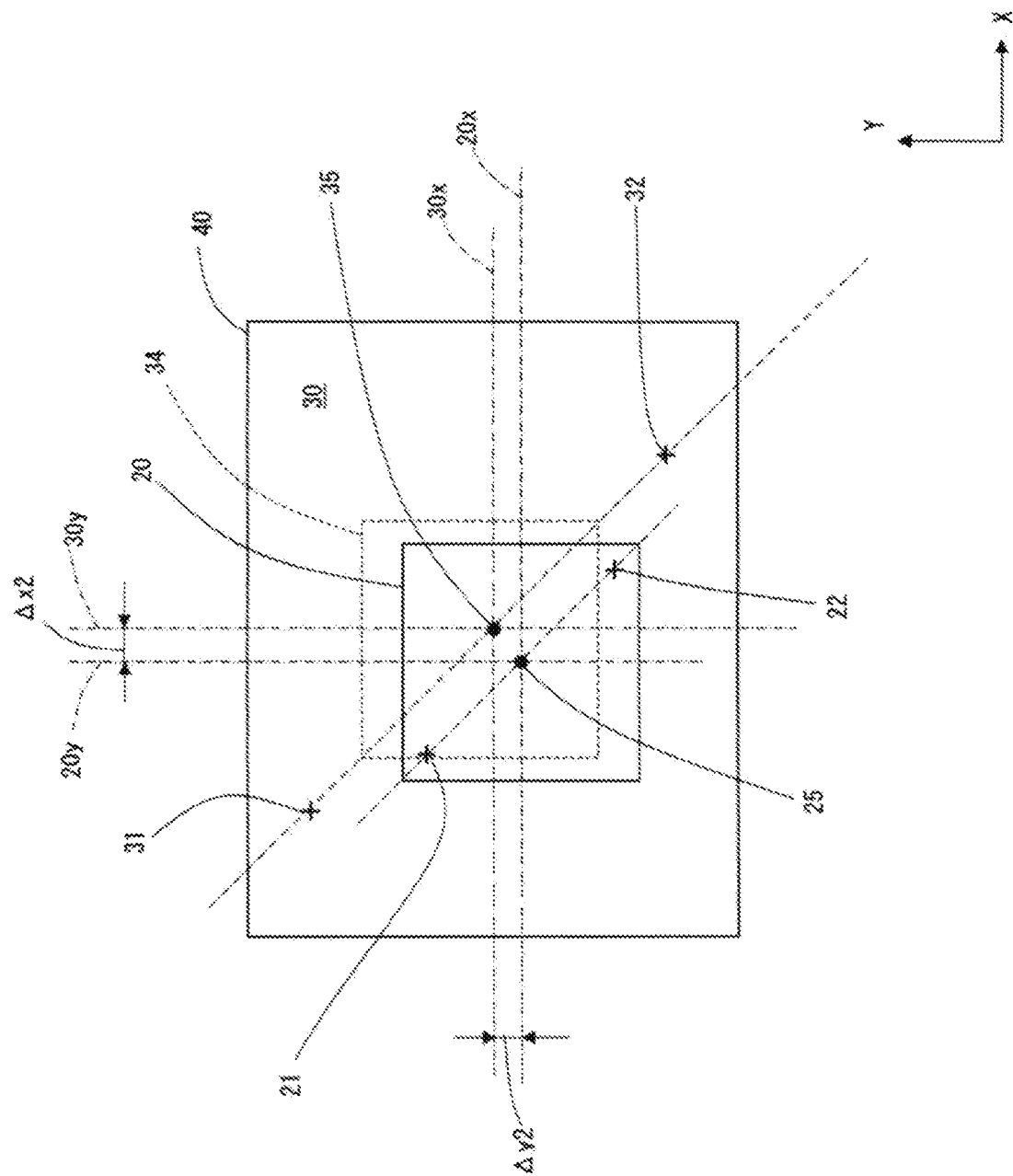
FIG. 6 is a view showing a visual field of the position detection camera that has imaged a semiconductor element and a substrate, which were bonded immediately before, upon actual position correction.

In step S110 of FIG. 3, the control part 50 moves the bonding head 11 to a position at which the semiconductor element 20 bonded immediately before and the substrate 30 in the vicinity thereof enter in the visual field 40 of the position detection camera 13 as shown in FIG. 6, in the vicinity of the position at which the bonding is performed immediately before, using the Y direction driving part of the bonding head 11 and the X direction driving part of the gantry frame 15. Then, as shown in step S111 of FIG. 3, the control part 50 images an image of the substrate 30 and the semiconductor element 20 bonded immediately before using the position detection camera 13, and acquires image data as shown in FIG. 6. The acquired image data is input to the control part 50.

As shown in FIG. 6, marks 31 and 32 are provided on the substrate 30 on a diagonal line of the target bonding position 34. A line that connects the marks 31 and 32 passes through the center 35 of the target bonding position 34. Here, the center 35 is an intersection between a centerline $30x$ in the X direction and a centerline $30y$ in the Y direction of the target bonding position 34. In addition, two marks 21 and 22 are also provided on the semiconductor element 20 on the diagonal line. Like the marks 31 and 32, a line that connects the marks 21 and 22 passes through the center 25 of the semiconductor element 20. The center 25 is an intersection between a centerline $20x$ in the X direction and a centerline $20y$ in the Y direction of the semiconductor element 20.

In step S112 of FIG. 3, the control part 50 analyzes the image imaged by the position detection camera 13 to detect XY coordinates of the marks 31 and 32 of the substrate 30, and calculates XY coordinates of the center 35 of the target bonding position 34 from the detected XY coordinates of the marks 31 and 32. Similarly, the XY coordinates of the center 25 of the semiconductor element 20 are calculated from the XY coordinates of the marks 21 and 22 of the semiconductor element 20. Then, the amounts of positional deviation $\Delta x2$ and $\Delta y2$ in the X direction and the Y direction of the center 25 that is the actual bonding position to which the semiconductor element 20 is actually bonded and the center 35 of the target bonding position 34 are calculated from the XY coordinates of the center 35 of the target bonding position 34 and the XY coordinates of the center 25 of the semiconductor element 20.

Then, the control part 50 advances to step S113 of FIG. 3, and performs actual position correction of correcting the amount of movement of the bonding head 11 by the amounts of positional deviation $\Delta x2$ and $\Delta y2$ calculated in step S112 of FIG. 3.

The control part 50 advances to step S114 of FIG. 3 after the actual position correction is performed in step S113 of FIG. 3, resets the cumulative values $\Sigma\Delta x1$ and $\Sigma\Delta y1$ stored in the memory to zero, and advances to step S114 of FIG. 3. That is, the control part 50 resets the cumulative values $\Sigma\Delta x1$ and $\Sigma\Delta y1$ that are cumulative values of the amounts of correction of the mark correction from the previous actual position correction to zero. For this reason, the control part 50 executes steps S110 to S114 of FIG. 3 whenever the cumulative value of the amounts of correction by the mark correction from the previous actual position correction reaches the prescribed first threshold $\Delta s$.

The control part 50 performs the bonding of the semiconductor element 20 at the target bonding position 34 in step S115 of FIG. 3 as a whole, and determines whether the bonding is terminated. When NO is determined in step S115 of FIG. 3, the control part 50 returns to step S102 of FIG. 3, and the bonding is continued while the mark correction and the actual position correction are performed. Meanwhile, when YES is determined in step S115 of FIG. 3, the control part 50 terminates the bonding operation.

Next, a time variation of a total amount of positional deviation $\Delta yt$, a total amount of correction $\Delta At$ in the Y direction and an amount of positional deviation $\Delta yr$ in the Y direction after correction in the operation of mark correction of step S102 to step S107 shown in FIG. 3 and an operation of actual position correction in steps S109 to S114 shown in FIG. 3 will be described with reference to FIG. 7. Further, while the following description will be described with respect to the Y direction and is also similar to the X direction.

Figure 7:
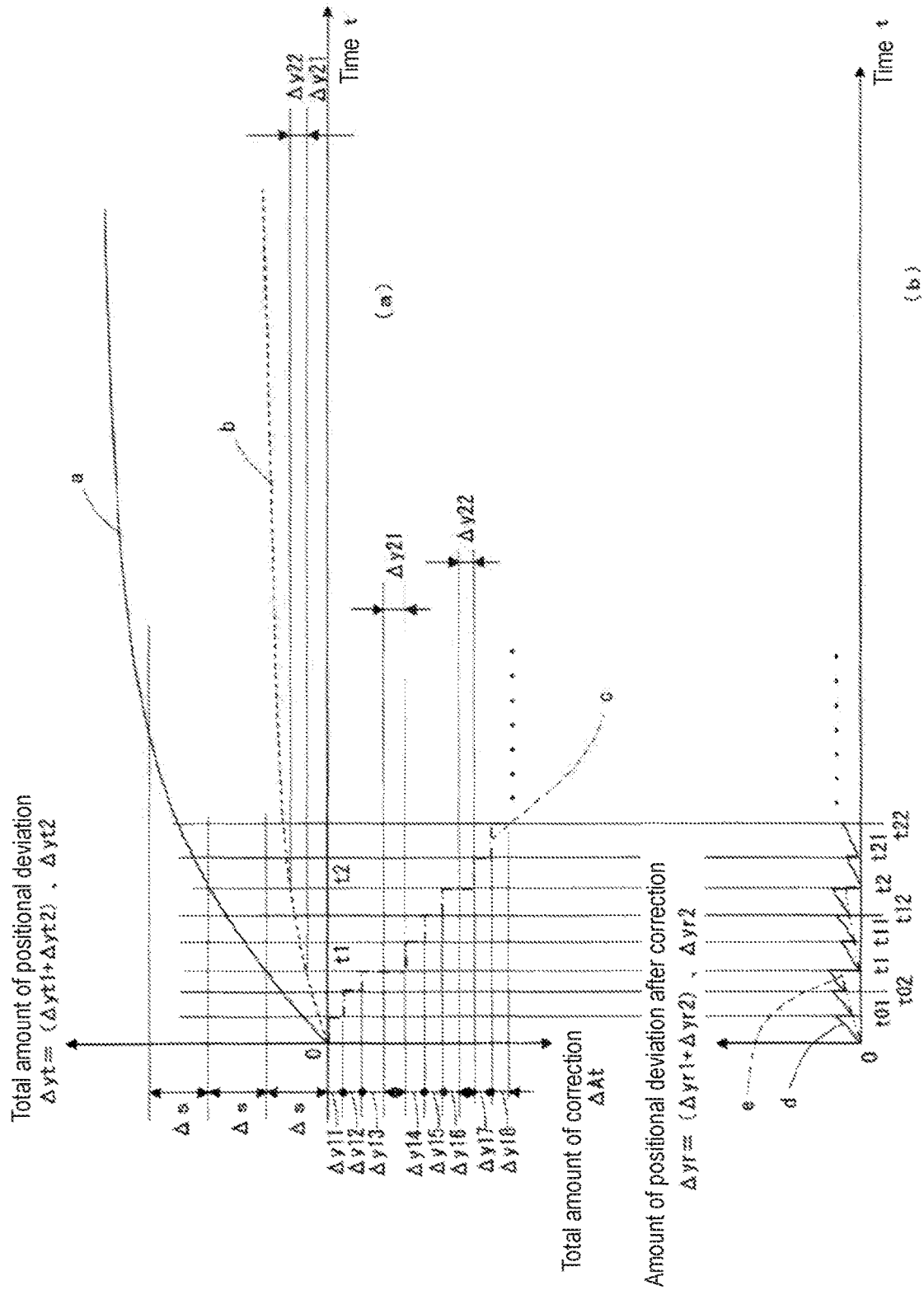
FIG. 7 is a view of (a) a graph showing a time variation between a total amount of positional deviation and a total amount of correction and (b) a graph showing a time variation of an amount of positional deviation after correction when bonding is performed using the bonding apparatus of the embodiment.

In (a) of FIG. 7 and (b) of FIG. 7, each of times t01, t02, t11, t12, t21 and t22 is timing when mark correction is performed, and times t1 and t2 are timings when actual position correction is performed. In addition, in (a) of FIG. 7, a solid line a indicates a time variation of the total amount of positional deviation $\Delta yt$ between an actual position and a command position of a center of the bonding nozzle 12 in the Y direction, a broken line b indicates a variation of a total amount of positional deviation $\Delta yt2$ in the Y direction between the bonding nozzle 12 and the optical axis 13z of the position detection camera 13, and a dashed line c indicates a time variation of the total amount of correction $\Delta At$ in the Y direction. Here, the total amount of positional deviation $\Delta yt$ between the actual position and the command position of the center of the bonding nozzle 12 in the Y direction is a total value of a total amount of positional deviation $\Delta yt1$ between the position of the position command value of the bonding head 11 and the actual position of the bonding head 11 and the total amount of positional deviation $\Delta yt2$ by a variation of a distance in the Y direction between the optical axis 13z of the position detection camera 13 and the central position of the bonding nozzle 12. Here, the total amount of positional deviations $\Delta yt$, $\Delta yt1$ and $\Delta yt2$ and the total amount of correction $\Delta At$ are cumulative values of the amounts of positional deviation from an initialized state.

In addition, in (b) of FIG. 7, a solid line d indicates a time variation of the amount of positional deviation $\Delta yr$ after correction in the Y direction between the actual position and the command position of the center of the bonding nozzle 12 in the Y direction, and a two-dot chain line e indicates a variation of the amount of positional deviation $\Delta yr2$ after correction in the Y direction between the bonding nozzle 12 and the optical axis 13z of the position detection camera 13. Here, the amount of positional deviation $\Delta yr$ after correction in the Y direction between the actual position and the command position of the center of the bonding nozzle 12 in the Y direction is a total value of the amount of positional deviation $\Delta yr1$ between the position of the position command value of the bonding head 11 and the actual position of the bonding head 11 and the amount of positional deviation $\Delta yr2$ by the variation of the distance in the Y direction between the optical axis 13z of the position detection camera 13 and the central position of the bonding nozzle 12. Here, the amount of positional deviations $\Delta yr$, $\Delta yr1$ and $\Delta yr2$ after correction is a cumulative value of the positional deviation amounts after the previous mark correction or the previous actual position correction.

Figure 4:
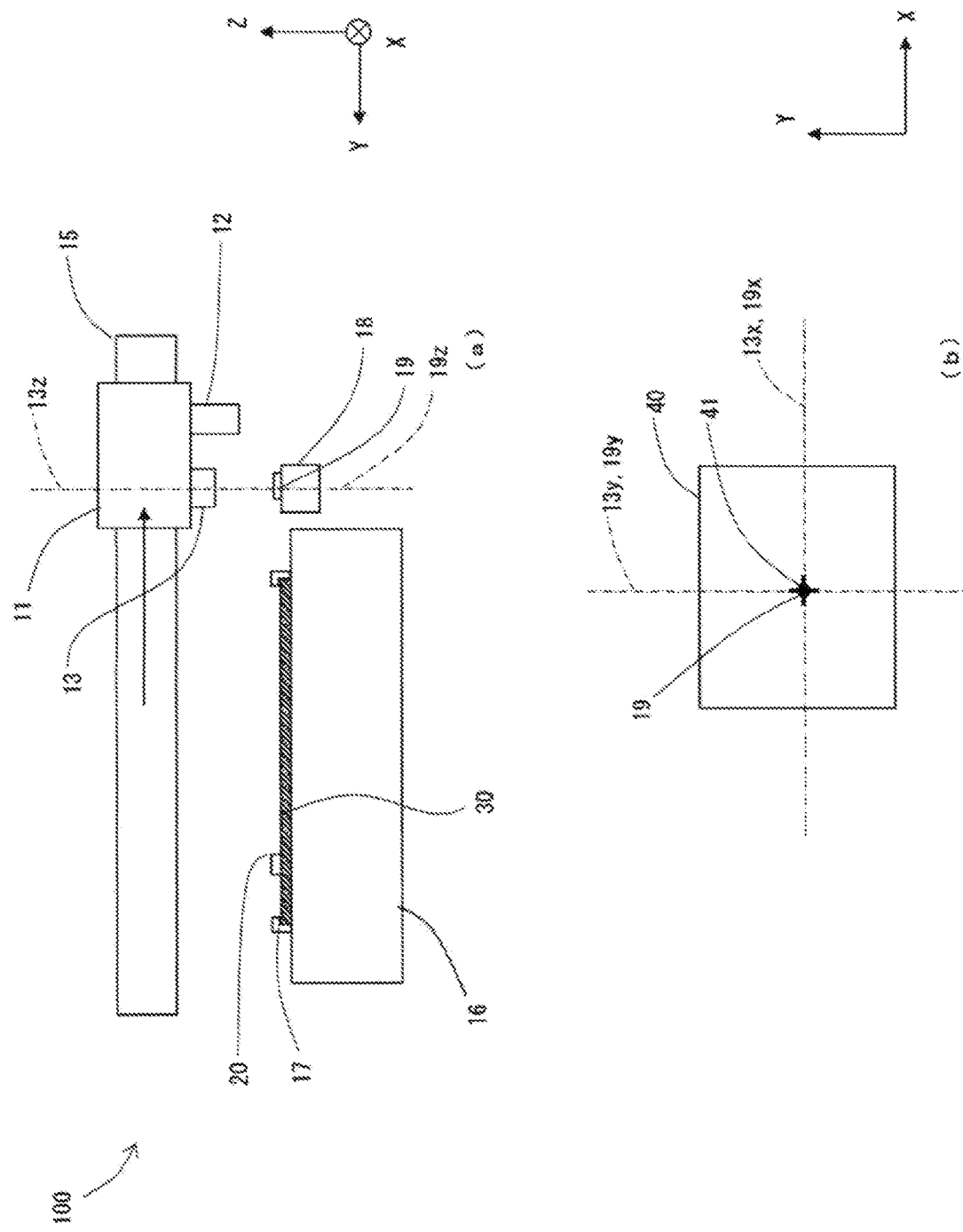
FIG. 4 is a view showing (a) a position of a bonding head and (b) a visual field of a position detection camera when the bonding apparatus of the embodiment is initialized.

The control part 50 at a time 0 shown in (a) of FIG. 7 performs initialization of the amount of movement of the bonding head 11 described with reference to step S101 of FIG. 3 and FIG. 4. Accordingly, at the time 0, the total amount of positional deviation $\Delta yt$ is zero. In addition, the total amount of correction $\Delta At$ and the amount of positional deviation $\Delta yr$ after correction are also zero.

When the bonding is started from the time 0 as shown in step S102 of FIG. 3, the respective parts start to thermally expand due to influence of heat or the like of a heater of the bonding stage 16. Accordingly, a positional deviation occurs between the position of the position command value of the bonding head 11 and the actual position of the bonding head 11. In addition, the bonding head 11 itself also thermally expands, and thus, a distance in the Y direction between the optical axis 13z of the position detection camera 13 and the central position of the bonding nozzle 12 is varied. For this reason, a positional deviation occurs between the actual position and the command position of the center of the bonding nozzle 12 in the Y direction.

When the bonding is started, the total amount of positional deviation $\Delta yt$ is increased together with the time as shown by the solid line a of (a) of FIG. 7. In addition, the total amount of positional deviation $\Delta yt2$ in the total amount of positional deviation $\Delta yt$ is also increased together with the time as shown in the broken line b of (a) of FIG. 7.

Then, when it is the time t01 that is a prescribed timing when the mark correction is performed, the control part 50 performs mark correction shown in FIG. 5 in steps S104 to S107 of FIG. 3. The control part 50 detects an amount of positional deviation $\Delta y1$ of $\Delta y11$ as shown by the dashed line c in (a) of FIG. 7 through mark correction at the time t01, and corrects the amount of movement of the bonding head 11 in the Y direction by the detected $\Delta y11$. Accordingly, the amount of positional deviation $\Delta y1$ is corrected, and the amount of positional deviation $\Delta yr$ after correction is decreased from $\Delta yr=(\Delta yr1+\Delta yr2)$ shown by the solid line d to $\Delta yr2$ shown by the two-dot chain line e in (b) of FIG. 7. Then, a total amount of correction $Ar$ at the time t01 is $\Delta y11$. In addition, a cumulative value $\Sigma\Delta y1$ of the amounts of correction from the previous actual position correction is $\Delta y11$. At this time, since the cumulative value $\Sigma\Delta y1$ does not exceed a first threshold Δs shown in (a) of FIG. 7, the control part 50 determines that it is NO in step S109 of FIG. 3, and returns to step S102 of FIG. 3 to continue execution of the bonding and the mark correction.

After the time t01, when the bonding is continued, the total amount of positional deviations Δyt and Δyt2 is increased as shown by the solid line a and the broken line b in (a) of FIG. 7 through thermal expansion. In addition, as shown by the solid line d and the two-dot chain line e in (b) of FIG. 7, the amount of positional deviations Δyr and Δyr2 after correction is greatly increased.

The control part 50 performs mark correction similarly to the time t01 when it is the time t02 that is the next prescribed timing when the mark correction is performed, detects the amount of positional deviation Δy1 of Δy12 as shown in (a) of FIG. 7, and corrects the amount of movement of the bonding head 11 in the Y direction by that extent. At the time t02, the amount of positional deviation Δyr after correction is decreased from Δyr=(Δyr1+Δyr2) shown by the solid line d to Δyr2 shown by the two-dot chain line e in (b) of FIG. 7. Then, a total amount of correction ΔAr at the time t02 is Δy11+Δy12. Even at the time t02, since the cumulative value ΣΔy1=Δy11+Δy12 of the amounts of correction from the previous actual position correction does not exceed the first threshold Δs shown in (a) of FIG. 7, the control part 50 determines that it is NO in step S109 of FIG. 3, and returns to step S102 of FIG. 3 to continue execution of the bonding and the mark correction.

Similarly, the control part 50 performs mark correction at the time t1 to detect the amount of positional deviation Δy1 of Δy13 as shown in (a) of FIG. 7, and corrects the amount of movement of the bonding head 11 in the Y direction by that extent. The total amount of correction Ar at the time t1 is Δy11+Δy12+Δy13. At the time t1, the cumulative value ΣΔy1=Δy11+Δy12+Δy13 of the amounts of correction from the previous actual position correction exceeds the prescribed first threshold Δ shown in (a) of FIG. 7, the control part 50 determines that it is YES in step S109 of FIG. 3 to execute actual position correction shown in steps S110 to S114 of FIG. 3.

The control part 50 first detects a position of the center 25 that is an actual bonding position of the semiconductor element 20 after bonding using the position detection camera 13 as described with reference to FIG. 6, and detects an amount of positional deviation Δy2 between the detected position of the center 25 of the semiconductor element 20 and the position of the center 35 of the target bonding position 34. At the time t1, the control part 50 detects Δy21 shown in (a) of FIG. 7 as the amount of positional deviation Δy2. Then, the control part 50 corrects the amount of movement of the bonding head 11 in the Y direction by the extent of Δy21.

Accordingly, the amount of positional deviation Δy2 that was not corrected is corrected, and the amount of positional deviation Δyr after correction at the time t1 becomes zero from Δyr2 shown by the two-dot chain line e in (b) of FIG. 7. Accordingly, at the time t1, the amount of positional deviation between the actual position and the command position of the center of the bonding nozzle 12 in the Y direction becomes zero.

The control part 50 advances to step S114 of FIG. 3 after correction of the amount of movement of the bonding head 11 in the Y direction in step S113 of FIG. 3, and resets the cumulative value ΣΔy1 that is the cumulative value of the amounts of correction by the mark correction from the previous actual position correction to zero. Then, when the bonding is not terminated, returning to step S102 of FIG. 3, the bonding in continued while performing the mark correction and the actual position correction.

Then, the mark correction is performed at the times t11, t12 and t2 in the same way as above, and the actual position correction is performed at the time t2 when the cumulative value ΣΔy1 of the amounts of correction by the mark correction from the previous actual position correction exceeds the prescribed first threshold Δs. In this way, the bonding apparatus 100 of the embodiment performs the bonding while performing the mark correction and the actual position correction.

Hereinabove, as described above, since the bonding apparatus 100 of the embodiment performs the actual position correction at every timing when the cumulative value ΣΔy1 of the amounts of correction by the mark correction from the previous actual position correction exceeds the prescribed first threshold Δs, it is possible to optimize the timing of the actual position correction and improve the bonding quality while maintaining productivity.

In the following description, while the actual position correction has been described as being performed at every time when the cumulative value ΣΔy1 of the amounts of correction by the mark correction from the previous actual position correction exceeds the prescribed first threshold Δs, there is no limitation thereto. For example, the actual position correction may be performed at every timing when a difference between the amount of correction by the mark correction executed previously and the amount of correction by the mark correction executed at this time exceeds a prescribed second threshold Δs2.

Accordingly, even when the actual bonding position is suddenly deviated, it is possible to optimize the timing of the actual position correction and improve bonding quality while maintaining productivity.

When the bonding is executed while correcting the amount of movement of the bonding head 11 using the bonding apparatus 100 described above, making the bonding apparatus 100 operational constitutes a preparing step of a method for correcting an amount of movement as shown in FIGS. 1 and 2, an operation of performing the mark correction at every prescribed timing constitutes a mark correction step of the method for correcting the amount of movement as shown in steps S103 to S107 of FIG. 3, and executing the actual position correction whenever the cumulative value ΣΔy1 of the amounts of correction of the mark correction exceeds the prescribed first threshold Δs constitutes an actual position correction step of the method for correcting the amount of movement as shown in steps S109 to S114 of FIG. 3.

Further, while the bonding apparatus 100 has been described as bonding the semiconductor element 20 on the substrate 30 in the embodiment, there is no limitation thereto, the semiconductor element 20 is bonded onto the substrate 30, and the other semiconductor element 20 may be bonded onto the semiconductor element 20. In addition, in the actual position correction, while the image in the vicinity of the semiconductor element 20 bonded immediately before has been described as being imaged, there is no limitation thereto, and the image in the vicinity of the bounded semiconductor element 20 may be imaged slightly before the timing when the cumulative value ΣΔy1 of the amounts of correction of the mark correction exceeds the prescribed first threshold Δs.

What is claimed is:

1. A bonding apparatus, characterized in comprising:
 a bonding head, on which a bonding nozzle configured to bond a semiconductor element adsorbed on a tip thereof onto a substrate or another semiconductor element is mounted, wherein the bonding head is configured to move in at least one direction;

a position detection camera, mounted on the bonding head and moving with movement of the bonding head;

a stage, configured to adsorb and fix the substrate on an upper surface, wherein the substrate moves on a first direction;

a reference mark, placed on an upper surface of a mark stand that is provided at a distance from the stage in a second direction, wherein the first direction and the second direction are directions orthogonal to each other in a horizontal plane; and a control part configured to adjust a position of the bonding head, wherein the control part is configured to perform mark correction at every prescribed timing and perform actual position correction at every other prescribed timing, the mark correction comprises: imaging the reference mark using the position detection camera, correcting an amount of movement of the bonding head on the basis of an amount of positional deviation between a position of the imaged reference mark and a reference position of the position detection camera, and calculating a cumulative value of amounts of correction of the mark correction from previous actual position correction;

the other prescribed timing is a timing when the cumulative value of amounts of correction of the mark correction from the previous actual position correction exceeds a prescribed first threshold;

the actual position correction comprises: detecting an actual bonding position of the semiconductor element after bonding using the position detection camera and correcting the amount of movement of the bonding head on the basis of an amount of positional deviation between the detected actual bonding position of the semiconductor element and a target bonding position.

2. The bonding apparatus according to claim 1, wherein the other prescribed timing is a timing when a difference between the amount of correction of a previous mark correction and the amount of correction of a current mark correction exceeds a prescribed second threshold.

3. A method for correcting an amount of movement of a bonding head, characterized in comprising:

a preparing step of preparing a bonding apparatus comprising a bonding head, on which a bonding nozzle configured to bond a semiconductor element adsorbed on a tip thereof onto a substrate or another semiconductor element is mounted, wherein the bonding head is configured to move in at least one direction, the bonding apparatus further comprises: a position detection camera mounted on the bonding head and moving with movement of the bonding head; a stage, configured to adsorb and fix the substrate on an upper surface, wherein the substrate moves on a first direction; and a reference mark, placed on an upper surface of a mark stand that is provided at a distance from the stage in a second direction, wherein the first direction and the second direction are directions orthogonal to each other in a horizontal plane;

a mark correction step, performed at every prescribed timing; and an actual position correction step, performed at every other prescribed timing, wherein the mark correction step comprises: imaging the reference mark using the position detection camera, correcting an amount of movement of the bonding head on the basis of an amount of positional deviation between a position of the imaged reference mark and a reference position of the position detection camera, and calculate a cumulative value of amounts of correction of the mark correction from previous actual position correction;

the other prescribed timing is a timing when the cumulative value of amounts of correction of the mark correction from the previous actual position correction exceeds a prescribed first threshold;

the actual position correction step comprises: detecting an actual bonding position of the semiconductor element after bonding using the position detection camera and correcting the amount of movement of the bonding head on the basis of an amount of positional deviation between the detected actual bonding position of the semiconductor element and a target bonding position.

4. The method for correcting an amount of movement of a bonding head according to claim 3, wherein the actual position correction step is executed when a difference between the amount of correction of a previous mark correction step and the amount of correction of a currently executed mark correction step exceeds a prescribed second threshold.

* * * * *